(12) United States Patent
Kim

(10) Patent No.: US 7,309,955 B2
(45) Date of Patent: Dec. 18, 2007

(54) ORGANIC ELECTROLUMINESCENT DISPLAY DEVICE AND FABRICATING METHOD THEREOF

(75) Inventor: Ock-Hee Kim, Annyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/267,284

(22) Filed: Nov. 7, 2005

(65) Prior Publication Data

US 2006/0113903 A1   Jun. 1, 2006

(30) Foreign Application Priority Data

Nov. 30, 2004   (KR) .................. 10-2004-0099089

(51) Int. Cl.
*H01J 1/62* (2006.01)
*H01J 63/04* (2006.01)
*H01L 51/40* (2006.01)

(52) U.S. Cl. ............. 313/500; 313/504; 313/506; 313/512; 445/24; 445/25; 438/99

(58) Field of Classification Search ........ 313/500–512; 438/99; 257/40; 445/24–25
See application file for complete search history.

(56) References Cited

U.S. PATENT DOCUMENTS

| | | | | |
|---|---|---|---|---|
| 6,498,428 | B1 * | 12/2002 | Matsuura et al. ........... | 313/506 |
| 6,744,197 | B2 * | 6/2004 | Park et al. ................... | 313/504 |
| 6,825,488 | B2 * | 11/2004 | Yamazaki et al. ............ | 257/40 |
| 6,828,587 | B2 * | 12/2004 | Yamazaki et al. ............ | 257/72 |
| 6,922,015 | B2 * | 7/2005 | Park et al. ................... | 313/506 |
| 6,927,536 | B2 * | 8/2005 | Kim et al. ................... | 313/504 |
| 6,982,524 | B2 * | 1/2006 | Park et al. ................... | 313/506 |
| 7,105,999 | B2 * | 9/2006 | Park et al. ................... | 313/505 |
| 7,109,650 | B2 * | 9/2006 | Park et al. ................... | 313/504 |
| 7,116,044 | B2 * | 10/2006 | Fukunaga ................... | 313/498 |
| 7,232,702 | B2 * | 6/2007 | Park et al. ................... | 438/82 |
| 2002/0110941 | A1 * | 8/2002 | Yamazaki et al. ............ | 438/25 |
| 2003/0146696 | A1 * | 8/2003 | Park et al. ................... | 313/506 |
| 2003/0201445 | A1 * | 10/2003 | Park et al. ................... | 257/79 |
| 2004/0017151 | A1 * | 1/2004 | Kim et al. ................... | 313/504 |
| 2004/0036410 | A1 * | 2/2004 | Park et al. ................... | 313/504 |
| 2004/0080266 | A1 * | 4/2004 | Park et al. ................... | 313/509 |
| 2004/0135520 | A1 * | 7/2004 | Park et al. ................. | 315/169.3 |
| 2004/0145306 | A1 * | 7/2004 | Park et al. ................... | 313/506 |
| 2004/0195959 | A1 * | 10/2004 | Park et al. ................... | 313/500 |
| 2005/0028860 | A1 * | 2/2005 | Sano et al. .................. | 136/249 |
| 2005/0127828 | A1 * | 6/2005 | Chung et al. ................ | 313/504 |
| 2005/0139839 | A1 * | 6/2005 | Park ............................ | 257/79 |
| 2005/0140281 | A1 * | 6/2005 | Park ............................ | 313/506 |
| 2005/0140282 | A1 * | 6/2005 | Park et al. ................... | 313/505 |
| 2005/0140285 | A1 * | 6/2005 | Park et al. ................... | 313/506 |
| 2005/0179374 | A1 * | 8/2005 | Kwak .......................... | 313/506 |
| 2005/0236956 | A1 * | 10/2005 | Chung et al. ................ | 313/463 |

* cited by examiner

*Primary Examiner*—Mariceli Santiago
*Assistant Examiner*—José M Diaz
(74) *Attorney, Agent, or Firm*—McKenna, Long & Aldridge LLP

(57) ABSTRACT

An electroluminescent display device includes first and second substrates facing each other and having a display area and a non-display area surrounding the display area. An array element is formed on the first substrate and an electroluminescent diode is formed on the second substrate. The electroluminescent display device further includes gate and data pad electrodes in the non-display area. The exposed portions of the gate and data pad electrodes are formed of a conductive material having a tolerance to corrosion.

44 Claims, 13 Drawing Sheets

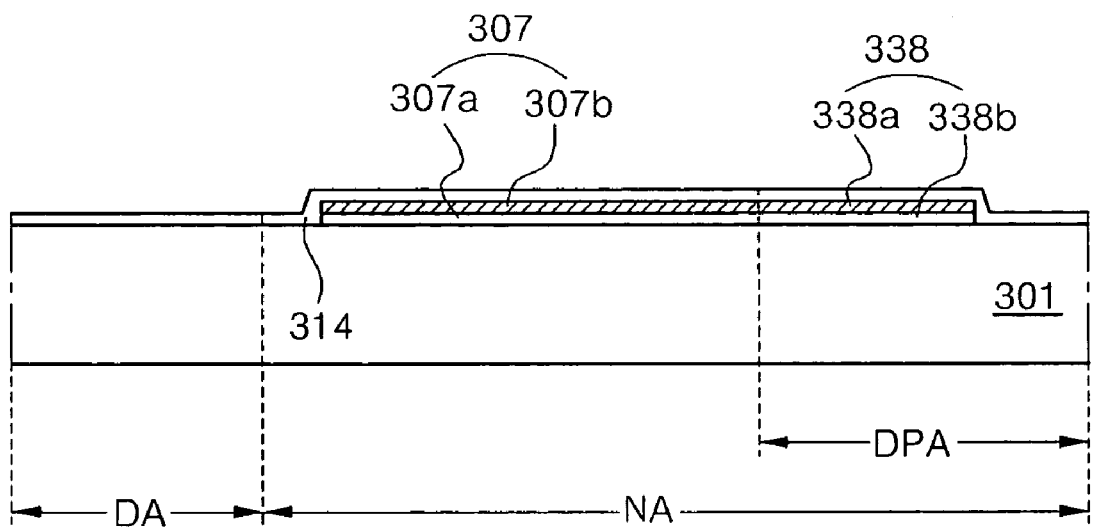
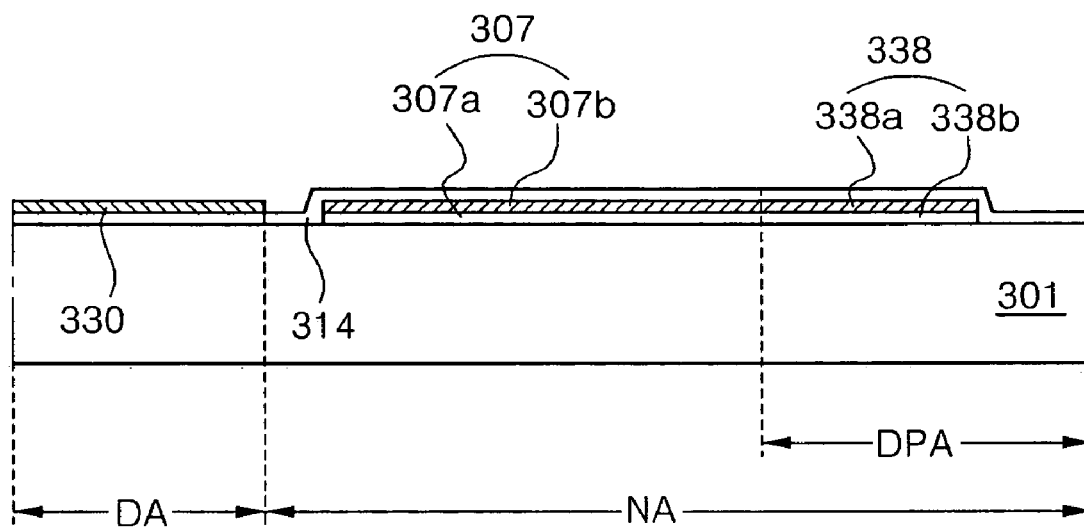

ORGANIC ELECTROLUMINESCENT DISPLAY DEVICE AND FABRICATING METHOD THEREOF

The present invention claims the benefit of Korean Patent Application No. 2004-0099089 filed in Korea on Nov. 30, 2004, which is hereby incorporated by reference for all purposes as if fully set forth herein.

BACKGROUND OF THE INVENTION

1. Field of the Invention

The present invention relates to a display device and a method of fabricating a display device, and more particularly, to an organic electroluminescent display (OELD) device and a method of fabricating an OELD device.

2. Discussion of the Related Art

In the past, many display devices have employed cathode-ray tubes (CRTs) to display images. However, various types of flat panel displays, such as liquid crystal display (LCD) devices, plasma display panel (PDP) devices, field emission display (FED) devices, and electro-luminescent display (ELD) devices, are currently being developed as substitutes for the CRTs. Among these various types of flat panel displays, the PDP devices have advantages of large display size, but have disadvantages of heaviness and high power consumption. Similarly, the LCD devices have advantages of thin profile and low power consumption, but have disadvantages of small display size. However, the OELD devices are luminescent displays having advantages of fast response time, high brightness, and wide viewing angles.

FIG. 1 is a schematic circuit diagram of an OELD device according to the related art.

As illustrated in FIG. 1, a gate line "GL" is extended along a first direction, and a data line "DL" and a power supply line "PSL" apart from each other are extended along a second direction perpendicular to the first direction. The gate line "GL", the data line "DL" and the power supply line "PSL" define a sub-pixel region "SP".

A switching thin film transistor "SwT" is disposed at a crossing portion of the gate and data lines "GL" and "DL" as an addressing element. A storage capacitor "$C_{ST}$" is connected to the switching thin film transistor "SwT" and the power supply line "PSL". A driving thin film transistor "DrT" is connected to the storage capacitor "$C_{ST}$" and the power supply line "PSL" as a current source element. An organic electroluminescent (EL) diode "E" is connected to the driving thin film transistor "DrT".

When a forward current is supplied to the organic EL diode "E", an electron and a hole are recombined to generate an electron-hole pair through the P(positive)-N(negative) junction between an anode, which provides the hole, and a cathode, which provides the electron. Because the electron-hole pair has an energy that is lower than the separated electron and hole, an energy difference exists between the recombination and the separated electron-hole pair, whereby light is emitted due to the energy difference.

In general, both of an array element including the switching and driving thin film transistors, and the organic EL diode are formed on an array substrate, and the array substrate is attached with an encapsulation substrate. Thus, the production efficiency of the OELD device is reduced. For example, when one of the array element and the organic emitting diode is determined to have a defect after fabrication, then the array substrate is unacceptable and thus the production efficiency of the OELD device is reduced.

To solve this problem, a dual-panel type OELD device is suggested, where the array element and the organic EL diode are formed on different substrates.

FIG. 2 is a cross-sectional view of a dual-panel type OELD device according to the related art, and FIG. 3 is a cross-sectional view of a data pad area of the dual-panel type OELD of FIG. 2.

As illustrated in FIGS. 2 and 3, first and second substrates 1 and 71 face and are spaced apart from each other. In the two substrates 1 and 71, a display area "DA" for displaying images and a non-display area "NA" surrounding the display area "DA" are defined. A seal pattern 93 attaches the first and second substrates 1 and 71 in the non-display area "NA". An array element including a driving thin film transistor "Tr" and a switching thin film transistor (not shown) is disposed in a sub-pixel region "SP" on the first substrate 1. An organic EL diode "E" is disposed on the second substrate 71 in the sub-pixel region "SP". The organic EL diode "E" includes a first electrode 75, an organic emitting layer 87 and a second electrode 90 sequentially disposed on an inner surface of the second substrate 71. The organic emitting layer 87 includes red (R), green (G) and blue (B) organic emitting layers 87a, 87b and 87c in the respective sub-pixel regions "SP". The second electrode 90 is disposed in each sub-pixel region "SP". A passivation layer 45 covers the substrate 1 having the driving thin film transistor "Tr" and has a drain contact hole 47 exposing a drain electrode 35. A connection electrode 55 is disposed on the passivation layer 45 in each pixel region "SP" and is connected to the drain electrode 35 through the drain contact hole 47. A connection pattern 91 connects the connection electrode 55 and the second electrode 90 in each sub-pixel region "SP".

In a gate pad area "GPA" of the non-display area "NA", a gate pad electrode 11 is disposed at the same layer as the gate electrode 9 and the gate line (not shown). The gate pad electrode 11 is made of the same material as the gate electrode 9. In a data pad area "DPA" of the non-display area "NA", a data pad electrode 38 is disposed at the same layer as source and drain electrodes 33 and 35 and the data line (not shown) on a gate insulator 14. Gate and data pad electrode terminals 57 and 60 are disposed on the passivation layer 45 and contacts the gate and data pad electrodes 11 and 38 through gate and data pad contact holes 49 and 51, respectively. The gate and data pad electrode terminals 57 and 60 are made of the same material as the connection electrode 55.

To improve interface properties and contact resistivities between the connection electrode 55 and the connection pattern 91 and between the connection pattern 91 and the second electrode 90, the connection electrode 55, the connection pattern 91 and the second electrode 90 are made of the same material. When the second electrode 90 acts as a cathode, the second electrode 90 is made of aluminum (Al) having a low work function. Accordingly, the connection electrode 55 and the connection pattern 91 also are made of aluminum (Al).

When aluminum (Al) is exposed to air, it is corroded. The connection electrode 55, the connection pattern 91 and the second electrode 90 formed of aluminum (Al) are not easily corroded, because they are disposed in the display area "DA" encapsulated by the seal pattern 93. In other words, a space between the first and second substrates surrounded by the seal pattern 93 is under a vacuum condition or filled with an inert gas. However, the gate and data pad electrode terminals 57 and 60, which are made of the same material, i.e., aluminum (Al), as the connection electrode 55, are exposed to air. Accordingly, the gate and data pad electrode terminals 57 and 60 are easily corroded.

Further, the gate and data pad electrodes 11 and 38 are generally made of a material having a low resistivity to prevent signal delay, such as aluminum (Al), aluminum alloy (AlNd), aluminum (Al)/molybdenum (Mo) and aluminum alloy (AlNd)/molybdenum (Mo), they are also easily corroded when they are exposed to air, even when the gate and data pad electrode terminals 57 and 60 are not formed in the gate and data pad areas "GPA" and "DPA". In particular, even when the gate and data pad electrodes 11 and 38 have a double-layered structure in which a upper layer is made of molybdenum (Mo) and a lower layer is made of either aluminum (Al) or aluminum alloy (Al/Nd), the lower layer can be exposed to air and corroded, because the upper layer may be etched along with the passivation layer 45 in a process of forming the contact holes 47, 49 and 51.

SUMMARY OF THE INVENTION

Accordingly, the present invention is directed to an OELD device and method of fabricating an OELD device that substantially obviate one or more of problems due to limitations and disadvantages of the related art.

An advantage of the present invention is to provide an OELD device and method of fabricating the same which can prevent corrosion of pad area and improve production efficiency.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the present invention, as embodied and broadly described, an electroluminescent display device includes first and second substrates facing each other and having a plurality of sub-pixel regions; a gate line on the first substrate; a data line crossing the gate line to define the sub-pixel region on the first substrate; an array element connected to the gate and data lines; a connection electrode connected to the array element and disposed in the sub-pixel region; a gate pad electrode electrically connected to the gate line and having lower and upper layers; a data pad electrode electrically connected to the data line and having lower and upper layers, the data pad electrode disposed at the same layer as the gate pad electrode; and an electroluminescent diode on the second substrate, wherein the upper layers of the gate and data pad electrodes have gate and data pad contact holes exposing the lower layers of the gate and data pad electrodes, respectively.

In another aspect, a method of fabricating an electroluminescent display device includes forming a gate line, a gate pad electrode at one end of the gate line and a data pad electrode on a first substrate, the gate line and the gate and data pad electrodes each having lower and upper layers; forming a gate insulator covering the gate line and the gate and data pad electrodes; forming a data line on the gate insulator crossing the gate line to define a sub-pixel region; forming an array element connected to the gate and data lines; forming a passivation layer on the array element; forming a connection electrode on the passivation layer in the sub-pixel region; exposing the lower layers of the gate and data pad electrodes; forming an electroluminescent diode on a second substrate; and attaching the first and second substrates.

In yet another aspect of the present invention, an electroluminescent display device includes a first substrate having an array element including a gate line, a data line crossing the gate line to define a pixel region, at least one thin film transistor (TFT) in the pixel region, a gate pad and a data pad; and a second substrate having an electroluminescent diode electrically connected to the TFT, wherein the gate and data pads have a multi-layered structure and exposed portions of the gate and data pads includes a conductive material having a tolerance to corrosion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings:

FIGS. 9A to 9H and 10A to 10H are cross-sectional views, which are taken along the lines VII-VII and VIII-VIII of FIG. 6, illustrating a method of fabricating a first substrate for a dual-panel type OELD device according to the third embodiment of the present invention.

DETAILED DESCRIPTION OF THE ILLUSTRATED EMBODIMENTS

Reference will now be made in detail to embodiments of the present invention, examples of which are illustrated in the accompanying drawings.

Figure 1:
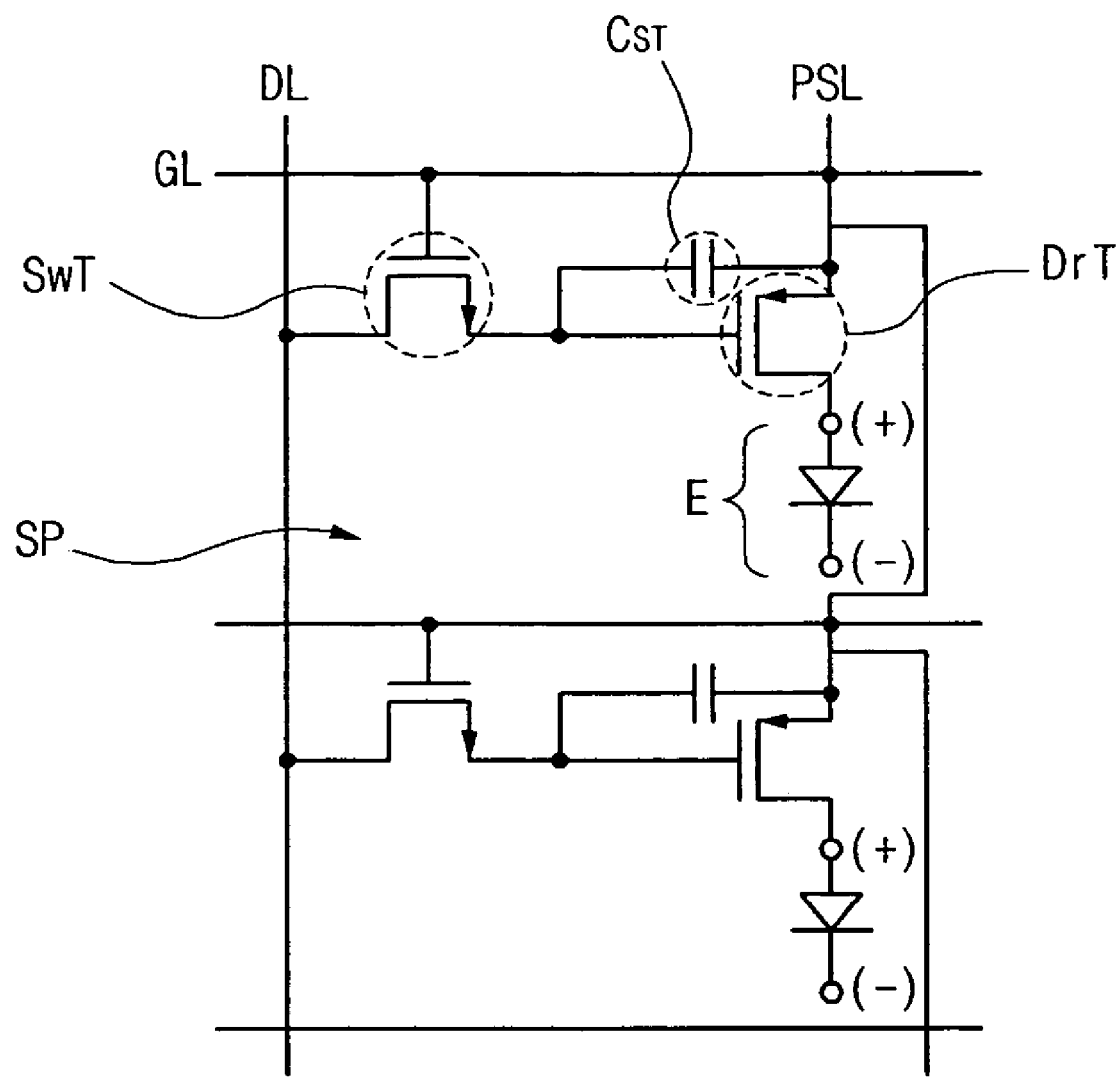
FIG. 1 is a schematic circuit diagram of an OELD device according to the related art.
Figure 2:
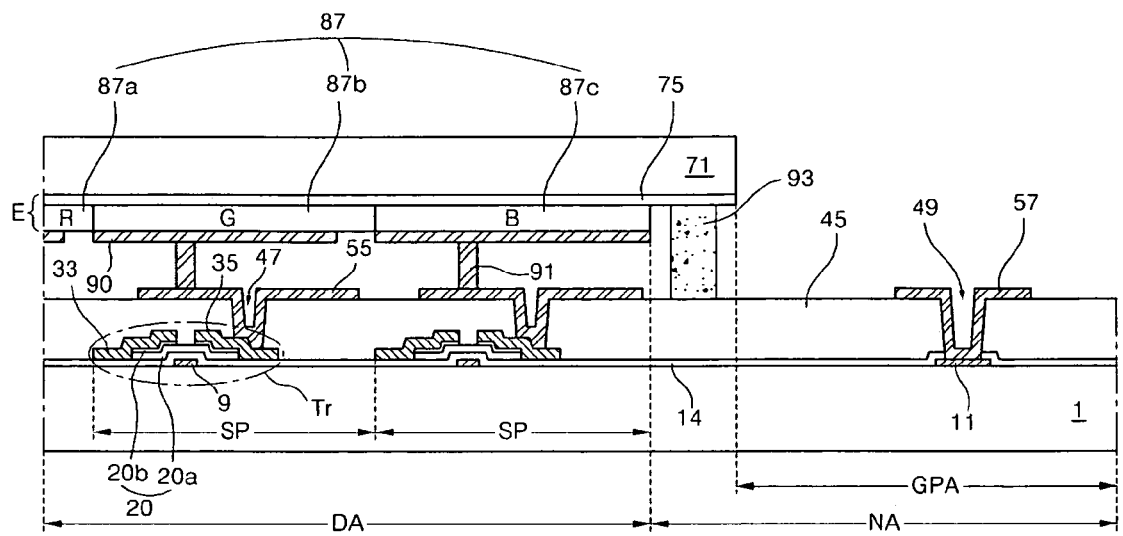
FIG. 2 is a cross-sectional view of a dual-panel type OELD device according to the related art.
Figure 3:
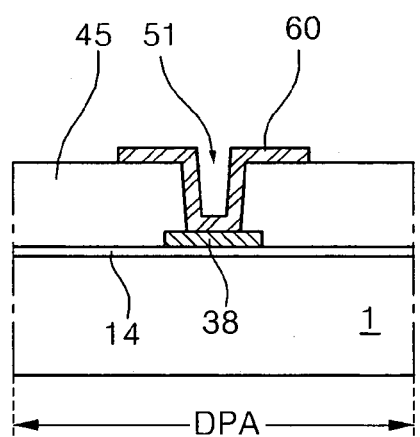
FIG. 3 is a cross-sectional view of a data pad area of the dual-panel type OELD of FIG. 2.
Figure 4A:
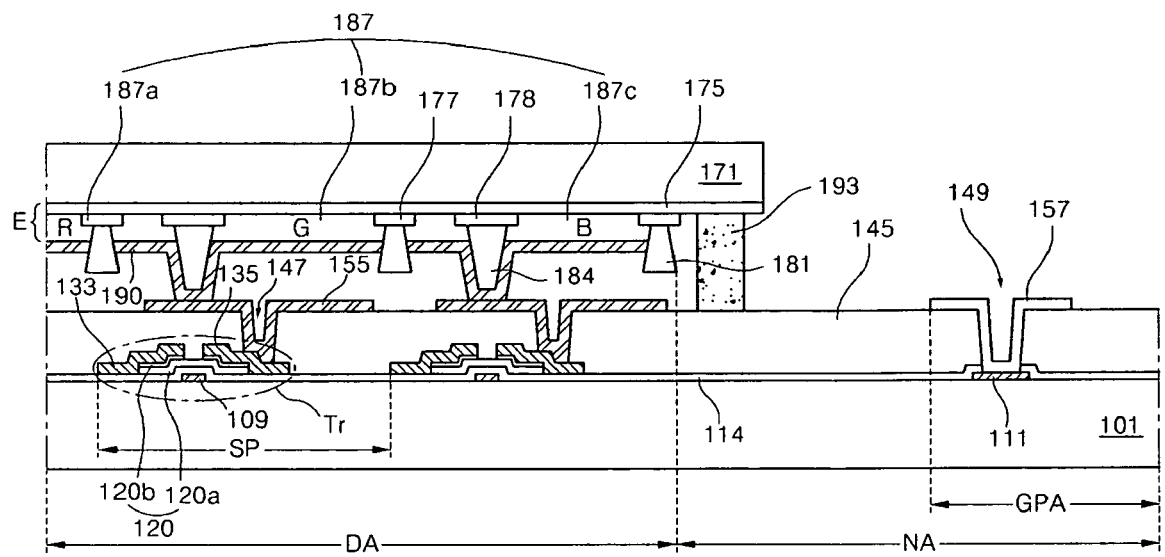
FIG. 4A is a cross-sectional view of a dual-panel type OELD device according to a first embodiment of the present invention.
Figure 4B:
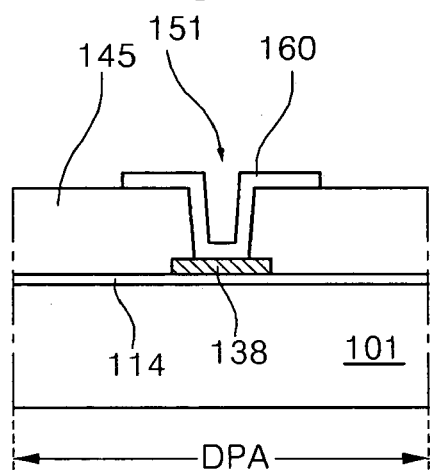
FIG. 4B is a cross-sectional view of a data pad area of the OELD device of the FIG. 4A.

FIG. 4A is a cross-sectional view of a dual-panel type organic electroluminescent display (OELD) device according to a first embodiment of the present invention, and FIG. 4B is a cross-sectional view of a data pad area of the OELD device of the FIG. 4A.

As illustrated in FIGS. 4A and 4B, a dual-panel type OELD device includes first and second substrates 101 and 171 facing and spaced apart from each other. In the two substrates 101 and 171, a display area "DA" and a non-display area "NA" surrounding the display area "DA" are defined. A seal pattern 193 is disposed in the non-display area "NA" and surrounds the display area "DA".

An organic electroluminescent (EL) diode "E" is disposed on an inner surface of the second substrate 171. The organic EL diode "E" includes a first electrode 175, an organic emitting layer 187 and a second electrode 190 that are sequentially disposed on the inner surface of the second substrate 171.

The first electrode 175 is disposed on the entire inner surface of the second substrate 171. First and second insulating patterns 177 and 178 are formed on the first electrode 175. A separator 181 is formed on the first insulating pattern 177 and disposed between adjacent sub-pixel regions "SP", and a spacer 184 is formed on the second insulating pattern 178. The spacer 184 has a height higher than the separator 181 such that the second electrode 190 contacts the connection electrode 155. The organic emitting layer 187 includes red (R), green (G) and blue (B) emitting layers 187a, 187b and 187c. The organic emitting layer 187 is disposed in each sub-pixel region "SP" and surrounded by the separator 181. Also, the second electrode 190 on the organic emitting layer 187 is disposed in each sub-pixel region "SP" and surrounded by the separator 181.

In the art of the OELD devices, the terms of anode and cathode are used interchangeably and anode is generally made of a material having a work function higher than that of cathode. Thus, the first electrode 175 can serve as either a cathode or anode in the OELD device, and when the first electrode 175 functions as a cathode, the second electrode 190 functions as an anode. When the first and second electrodes 175 and 190 function as an anode and a cathode, respectively, the first electrode 175 may have a work function higher than the second electrode 190. In such a case, the first electrode 175 may be made of a transparent conductive material such as indium-tin-oxide (ITO) and indium-zinc-oxide (IZO) and the second electrode 190 may be made of an opaque conductive material such as alkaline metal, alkaline-earth metal, aluminum (Al), aluminum alloy (AlNd), copper (Cu), molybdenum (Mo), titanium (Ti) and an alloy thereof. Alternatively, the first and second electrodes 175 and 190 may be made of an opaque conductive material and a transparent conductive material, respectively.

A spacer 184 is disposed on the inner surface of the second substrate 171 in each sub-pixel region "SP". The spacer 184 has a height higher than the separator 181 such that the second electrode 190 contacts a connection electrode 155 on the first substrate 101. The organic emitting layer 187 in each sub-pixel region "SP" is separated by the spacer 184. Also, the second electrode 190 is continuous in the sub-pixel region "SP" and includes a first portion on the organic emitting layer 187 and a second portion covering the spacer 184. The second portion protruded by the spacer 184 contacts the connection electrode 155.

Although not shown in the drawings, a gate line, and a data line and a power supply line crossing the gate line define the sub-pixel region "SP" on an inner surface of the first substrate 101. Also, an array element including a driving thin film transistor "Tr" and a switching thin film transistor (not shown) is disposed on the inner surface of the first substrate 101. The driving thin film transistor "Tr" includes a gate electrode 109 on the first substrate 101, an gate insulator 114 covering the gate electrode 109, a semiconductor layer 120 on the gate insulator 114, and source and drain electrodes 133 and 135 on the semiconductor layer 120. The semiconductor layer 120 includes an active layer 120a and an ohmic contact layer 120b. A passivation layer 145 is disposed to cover the array element and the data line. The connection electrode 155 is disposed on the passivation layer 145 in the sub-pixel region "SP" and contacts the drain electrode 135 through a drain contact hole 147.

In the non-display area "NA" of the first substrate 101, gate and data pad electrodes 111 and 138 are disposed at ends of the gate and data lines, respectively. On the gate pad electrode 111, the gate insulator 114 and the passivation layer 145 having a gate pad contact hole 149 are disposed. On the data pad electrode 138, the passivation layer 145 having a data pad contact hole 151 is disposed. Gate and data pad electrode terminals 157 and 160 are disposed on the passivation layer 145 and contact the gate and data pad electrodes 111 and 138 through the gate and data pad contact holes 149 and 151, respectively.

The connection electrode 155 contacting the second electrode 190 may be made of the same material as the second electrode 190 for interface properties and contact resistivities between the connection electrode 155 and the second electrode 190. The connection electrode 155 and the second electrode 190 may be made of a conductive material such as aluminum (Al), aluminum alloy (AlNd), copper (Cu), molybdenum (Mo), titanium (Ti) and an alloy thereof.

The gate and data pad electrode terminals 157 and 160, which are exposed to air, may be made of a conductive material having a tolerance to corrosion, such as indium-tin-oxide (ITO) and indium-zinc-oxide (IZO).

Figure 5A:
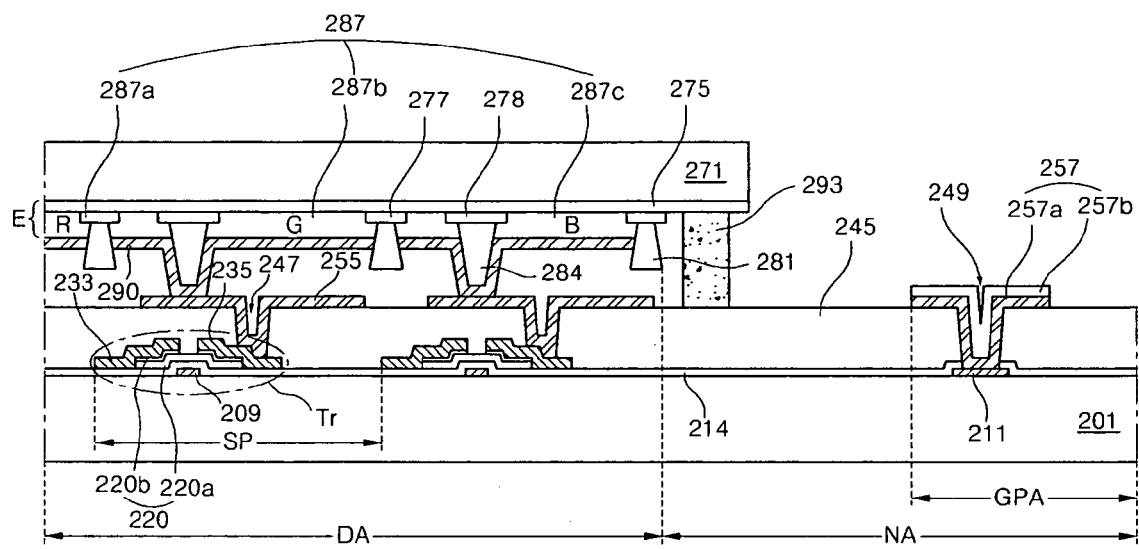
FIG. 5A is a cross-sectional view of a dual-panel type OELD device according to a second embodiment of the present invention.
Figure 5B:
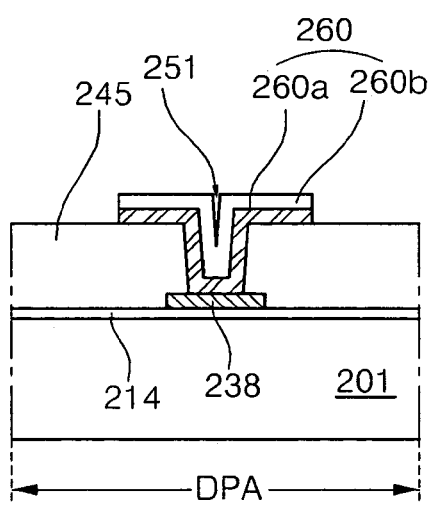
FIG. 5B is a cross-sectional view of a data pad area of the OELD device of the FIG. 5A.

FIG. 5A is a cross-sectional view of a dual-panel type OELD device according to a second embodiment of the present invention, and FIG. 5B is a cross-sectional view of a data pad area of the OELD device of the FIG. 5A. The OELD device of the second embodiment is similar to the OELD device of the first embodiment, except for structures of gate and data pads. Accordingly, detailed explanation of the similar parts to the first embodiment will be omitted.

As illustrated in FIGS. 5A and 5B, gate and data pad electrode terminals 257 and 260 have a double-layered structure. Lower layers 257a and 260a of the gate and data pad electrode terminals 257 and 260 may be made of the same material as the connection electrode 255 and the second electrode 290. In other words, the lower layers 257a and 260a may be made of a conductive material having a low work function, such as aluminum (Al) and aluminum alloy (AlNd). Upper layers 257b and 260b of the gate and data pad electrode terminals 257 and 260 may be made of a conductive material having a tolerance to corrosion, such as indium-tin-oxide (ITO) and indium-zinc-oxide (IZO). A corrosion of the gate and data pad electrode terminals 257 and 260 can be minimized or prevented by forming the corrosion-proof upper layers 257b and 260b on the lower layers 257a and 260a that are susceptible to corrosion.

In the above-described first and second embodiments, the transparent conductive material having a tolerance to corrosion, such as indium-tin-oxide (ITO) and indium-zinc-oxide (IZO), is used to prevent the gate and data pad electrode terminals from being corroded under an air condition. To form such a corrosion-proof layer, an additional mask process is required.

Hereinafter, an OELD device that can minimize or prevent a corrosion of the gate and data pads without an additional mask process will now be described.

Figure 6:
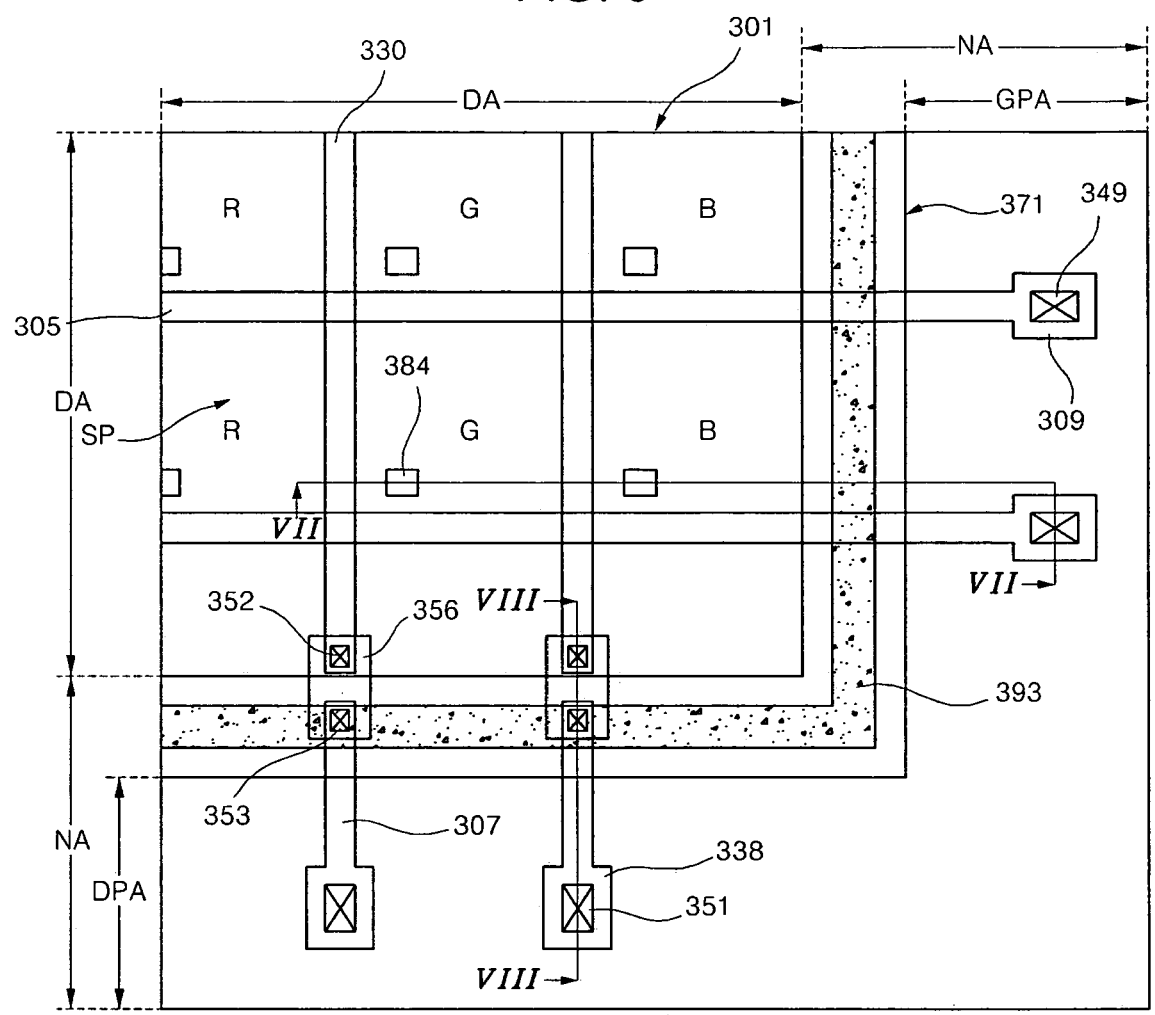
FIG. 6 is a schematic plan view of a dual-panel type OELD device according to a third embodiment of the present invention.

FIG. 6 is a schematic plan view of a dual-panel type OELD device according to a third embodiment of the present invention.

As illustrated in FIG. 6, the OELD device has a display area "DA" where a plurality of sub-pixel regions "SP" are arranged, and a non-display area "NA" where gate and data pads supplied with driving signals are arranged. The sub-pixel regions "SP" are defined by gate and data lines 305 and 330 crossing each other.

Although not shown in FIG. 6, in each sub-pixel region "SP", an array element including a switching thin film transistor and a driving thin film transistor is disposed on a first substrate, and an organic EL diode including a first electrode, an organic emitting layer and a second electrode is disposed on a second substrate facing the first substrate.

The gate line 305 is extended along a first direction into a gate pad area "GPA" of the non-display area "NA", and a gate pad electrode 309 is disposed at one end of the gate line 305 in the gate pad area "GPA".

The data line 330 is extended along a second direction crossing the first direction into a boundary area between the display area "DA" and the non-display area "NA". A data link line 307 is spaced apart from the data line 330 and extended along the second direction in the non-display area "NA", and a data pad electrode 338 is disposed at one end of the data link line 307 in a data pad area "DPA". The data link line 307 and the data pad electrode 338 are made of the same material as the gate line 305.

The data link line 307 is connected to the data line 330 through a link pattern 356, which extends across the boundary area between the display area "DA" and the non-display area "NA". To connect the data line 330 and the data link line 307, the link pattern 356 contacts one end of the data line 330 through a first link contact hole 352 and contacts the other end of the data link line 307 through a second link contact hole 353. A portion of the link pattern 356 underlies a seal pattern 393 and the other portion of the link pattern 356 is surrounded by the seal pattern 393, and thus the link pattern 356 is not exposed to air. In other words, the link pattern 356 is surrounded by an outline of the seal pattern 393. Accordingly, the link pattern 356 is not corroded because a space between the first and second substrates surrounded by the seal pattern 393 is under a vacuum condition or filled with an inert gas.

Figure 7:
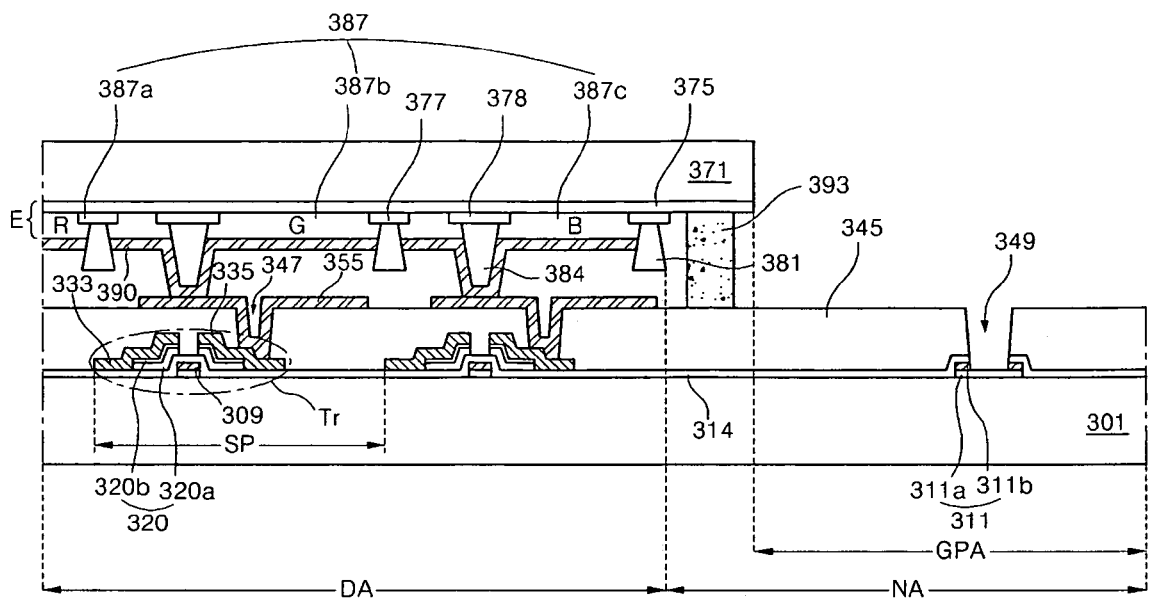
FIGS. 7 and 8 are cross-sectional views taken along the lines VII-VII and VIII-VIII of FIG. 6.
Figure 8:
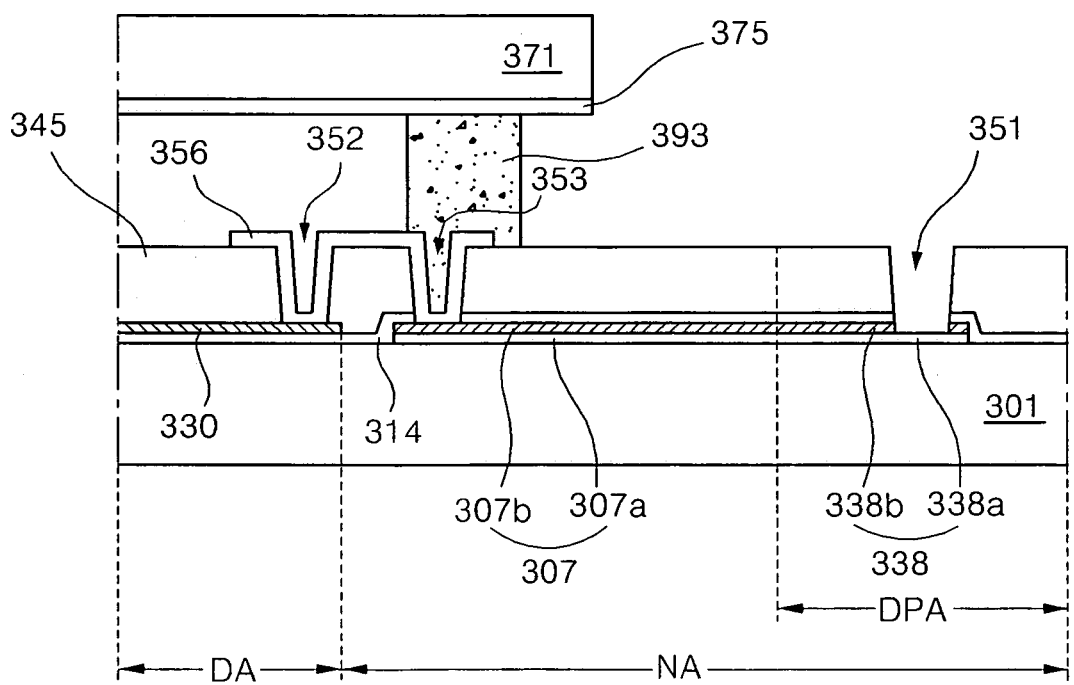

FIGS. 7 and 8 are cross-sectional views taken along lines the VII-VII and VIII-VIII of FIG. 6. The OELD device of the third embodiment is similar to the OELD devices of the first and second embodiments, except for stacking structures of gate and data pads and connection structures of a data line and a data link line. Accordingly, detailed explanation of the similar parts to the first and second embodiments will be omitted.

As illustrated in FIGS. 7 and 8, in a display area "DA" of a first substrate 301, an array element including a driving thin film transistor "Tr" and a switching thin film transistor (not shown) is disposed in each sub-pixel "SP". The driving thin film transistor "Tr" includes a gate electrode 309 on an inner surface of the first substrate 301, an gate insulator 314 on the gate electrode 309, a semiconductor layer 320 on the gate insulator 314, and source and drain electrodes 333 and 335 on the semiconductor layer 320. A passivation layer 345 is disposed on the entire first substrate 301 having the driving thin film transistor "Tr".

In a gate pad area "GPA" of a non-display area "NA" of the first substrate 301, a gate pad electrode 311 is extended from a gate line (305 of FIG. 6) and is disposed at one end of the gate line. Also, a data link line 307 connected to the data line 330 is disposed in the non-display area "NA", and a data pad electrode 338 is extended from the data link line 307 and disposed at one end of the data link line 307 in a data pad area "DPA". The data link line 307 and the data pad electrode 338 are made of the same material as the gate line and the gate pad electrode 311 and disposed at the same layer as the gate line and the gate pad electrode 311.

The gate line, gate pad electrode 311, the data link line 307 and the data pad electrode 338 have at least two layers. Lower layers 307a, 311a and 338a of the gate line, the data link line 307, the gate pad electrode 311 and the data pad electrode 338 may be made of a transparent conductive material having a tolerance to corrosion, such as indium-tin-oxide (ITO) and indium-zinc-oxide (IZO). Upper layers 307b, 311b and 338b may be made of a conductive material having a low resistivity, such as aluminum (Al) or aluminum alloy (AlNd). Although the upper layer 307b, 311b or 338b having a single-layered structure is illustrated in FIGS. 7 and 8, the upper layer may have a double-layered structure, such as aluminum (Al)/molybdenum (Mo) or aluminum alloy (AlNd)/molybdenum (Mo).

The gate insulator 314 and the passivation layer 345 are sequentially disposed on the gate line, the data link line 307, the gate pad electrode 311 and the data pad electrode 338. In the gate and data pad areas "GPA" and "DPA", the gate insulator 314 and the passivation layer 345 have gate and data pad contact holes 349 and 351 exposing the gate and data pad electrodes 311 and 338, respectively. In particular, the upper layers 311b and 338b of the gate and data pad electrodes 311 and 338 are removed to have the gate and data pad contact holes 349 and 351 such that the lower layers 311a and 338a are exposed through the gate and data pad contact holes 349 and 351. Because the upper layers 311b and 338b are susceptible to corrosion and the lower layers 311a and 338a have a tolerance to corrosion, the upper layers 311b and 338b are etched to expose the lower layers 331a and 338a. Accordingly, a corrosion of the gate and data pad electrodes 311 and 338 can be minimized or prevented.

Further, the passivation layer 345 has a first link contact hole 352 exposing one end of the data line 330, and the passivation layer 345 and the gate insulator 314 has a second link contact hole 353 exposing the other end of the data link line 307, and thus a link pattern 356 connects the data line 330 and the data link line 307 through the first and second link contact holes 352 and 353, respectively. Accordingly, the data line 330 is connected to the data link line 307 through the link pattern 356.

A portion of the link pattern 356 underlies a seal pattern 393 and the other portion of the link pattern 356 is surrounded by the seal pattern 393. The other portion of the link pattern 356, which is exposed on a space between the first and second substrates surrounded by the seal pattern 393, is not corroded because the space is under a vacuum condition or filled with an inert gas. Also, the portion of the link pattern 356 below the seal pattern 393 is not corroded because the portion of the link pattern 356 does not contact exterior air due to the seal pattern 393. Accordingly, the link pattern 356 that is not exposed to an air condition may be made of a conductive material having a low resistivity, although the material is susceptible to corrosion.

As described above, in the third embodiment, the gate and data pad electrodes has the lower layers having a tolerance to corrosion, and the lower layers are exposed to an air condition. Further, the link pattern is shielded from an air condition due to the seal pattern. Accordingly, a corrosion of the gate and data pad electrodes and the link pattern can be minimized or prevented.

FIGS. 9A to 9H and 10A to 10H are cross-sectional views, which are taken along the lines VII-VII and VIII-VIII of FIG. 6, illustrating a method of fabricating a first substrate for a dual-panel type OELD device according to the third embodiment of the present invention.

Figure 9A:
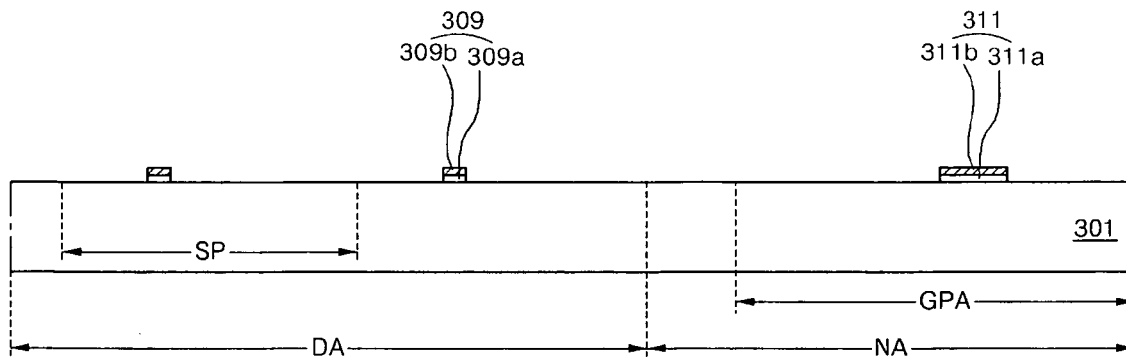
Figure 10A:
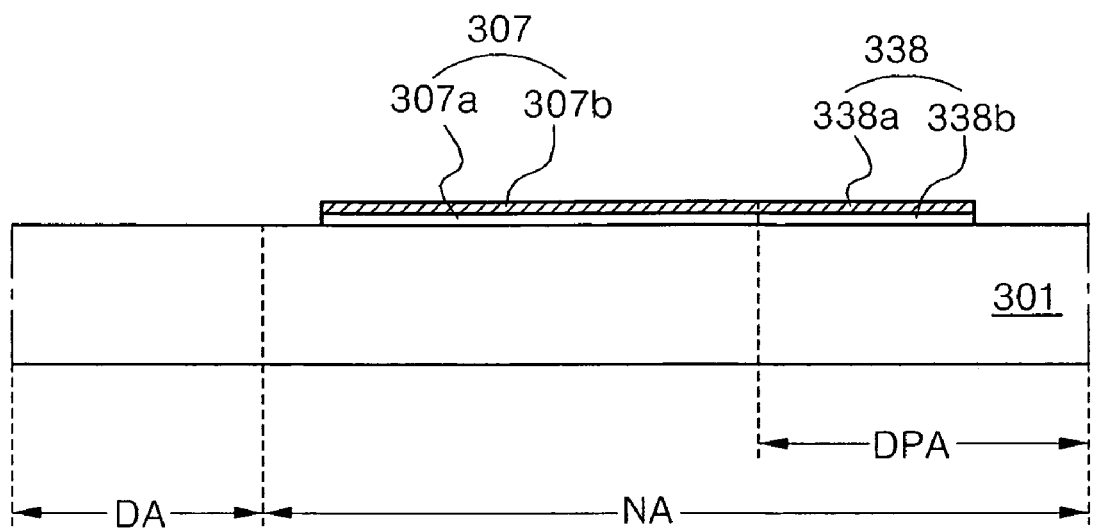

As illustrated in FIGS. 9A and 10A, a first conductive material having a tolerance to corrosion, such as indium-tin-oxide (ITO) and indium-zinc-oxide (IZO) is deposited on a first substrate 301 to form a first layer (a lower layer). Subsequently, a second conductive material having a low resistivity is deposited on the first layer to form a second layer (a upper layer). The second layer may have a single-layered structure made of one of aluminum (Al), aluminum alloy (AlNd), copper (Cu), molybdenum (Mo) and titanium (Ti), or a multi-layered structure made of at least two of the above materials.

A mask process (i.e., a photolithograph process) is conducted to pattern the first and second layers, which includes depositing a photoresist on the first and second layers, exposing light with a mask, developing the photoresist, etching the first and second layers, and stripping or ashing the residual photoresist. Through the mask process, a gate line (305 of FIG. 6), a gate electrode 309 extended from the gate line, a gate pad electrode 311 in a gate pad area (GPA), a data link line 307 in a non-display area "NA", and a data pad electrode 338 in a data pad area "DPA" are formed. Each of the gate line, the data link line 307, the gate electrode 309, the gate pad electrode 311, and the data pad electrode 338 has the patterned first layer (the lower layer) 307a, 309a, 311a or 338a, and the patterned second layer (the upper layer) 307b, 309b, 311b or 338b.

Figure 9B:
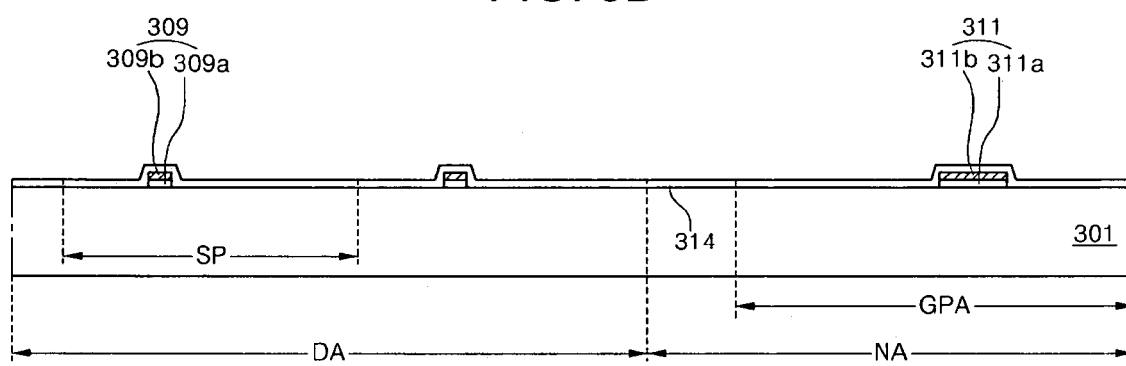
Figure 10B:
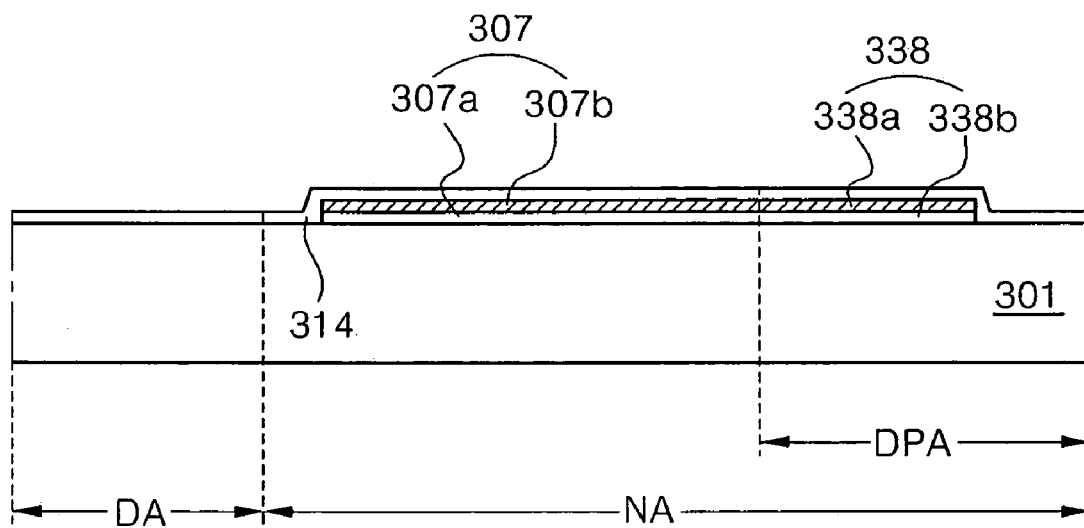

As illustrated in FIGS. 9B and 10B, an inorganic insulating material is deposited on the entire substrate 101 having the gate electrode 309 to form a gate insulator 314. The organic insulating material may be one of silicon oxide ($SiO_2$) and silicon nitride (SiNx).

Figure 9C:
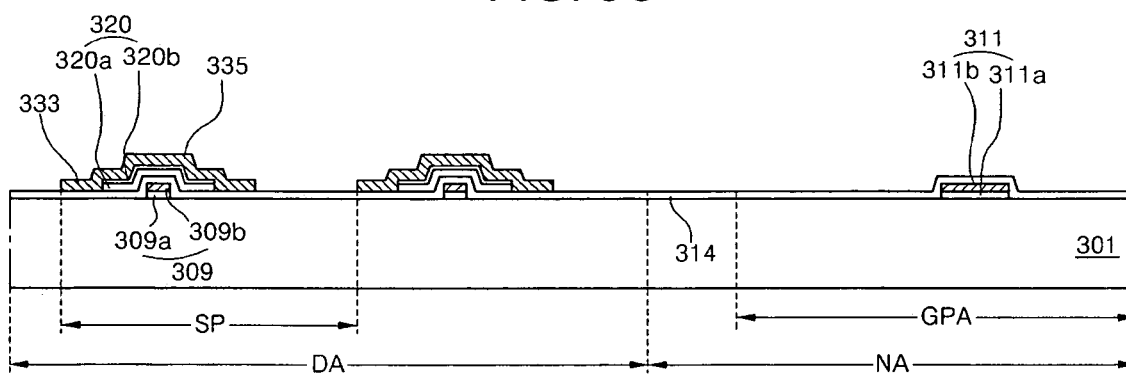

As illustrated in FIGS. 9C and 10C, amorphous silicon (a-Si) and impurity-doped amorphous silicon (n+ a-Si) are sequentially deposited on the gate insulator 314 and patterned with a mask process to form a semiconductor layer 320. The semiconductor layer 320 includes an active layer 320a of amorphous silicon and an ohmic contact layer 320b of impurity-doped amorphous silicon.

Figure 9D:
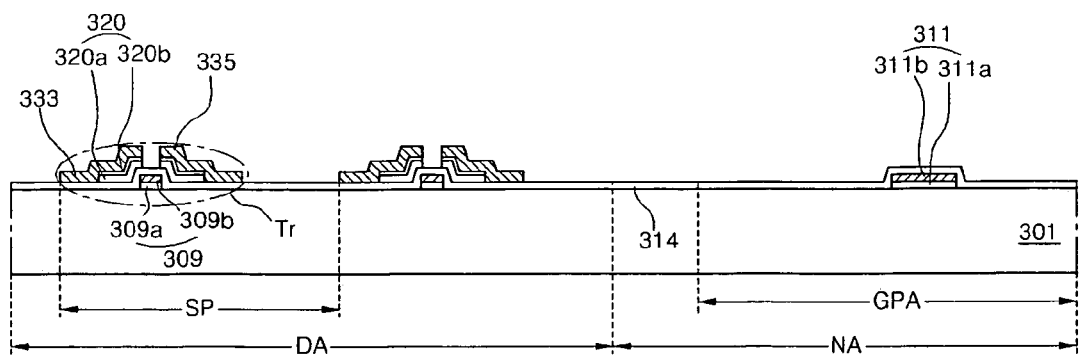

As illustrated in FIGS. 9D and 10D, a third conductive material is deposited on the substrate 301 having the semiconductor layer 320 and patterned with a mask process to form a data line 330, and source and drain electrodes 333 and 335. The third conductive material may be one of aluminum (Al), aluminum alloy (AlNd), chromium (Cr), molybdenum (Mo), titanium (Ti), copper (Cu) and copper alloy. Also, the data line 330, and the source and drain electrodes 333 and 335 may have a multi-layered structure made of at least two of the above materials. The data line 330 crosses the gate line to define a sub-pixel region "SP" in a display area "DA". The source and drain electrodes 333 and 335 spaced apart from each other contact the ohmic contact layer 320b therebelow. The gate electrode 309, the gate insulator 314, the semiconductor layer 320 and the source and drain electrodes 333 and 335 form a driving thin film transistor "Tr". Although not shown in the drawings, a switching thin film transistor is formed simultaneously with the driving thin film transistor "Tr" and has a similar structure to the driving thin film transistor "Tr".

Figure 9E:
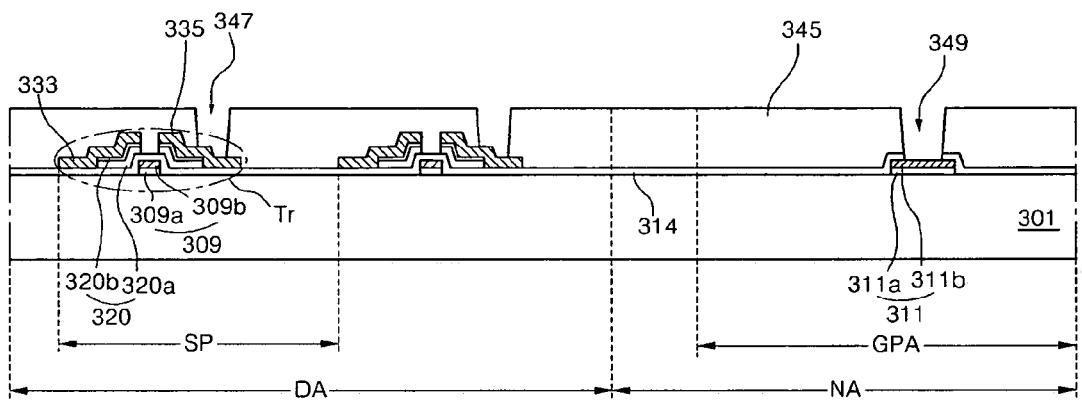
Figure 10E:
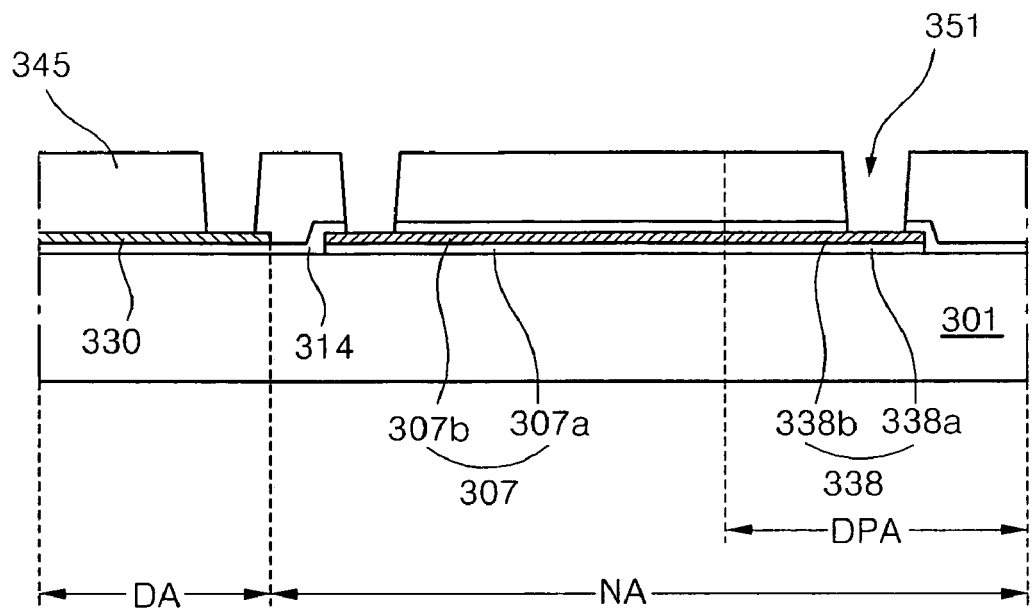

As illustrated in FIGS. 9E and 10E, an organic insulating material or an inorganic insulating material is deposited on the entire substrate 301 having the data line 330 to form a passivation layer 345. The organic insulating material may be one of benzocyclobutene (BCB) and photo acrylic, and the inorganic insulating material may be one of silicon oxide ($SiO_2$) and silicon nitride (SiNx). The passivation layer 345 is patterned with a mask process to form a drain contact hole 347 exposing the drain electrode 335 and a first link contact hole 352 exposing one end of the data line 330. Also, the gate insulator 314 is patterned along with the passivation layer 345 to form a gate pad contact hole 349 exposing the gate pad electrode 311, a data pad contact hole 351 exposing the data pad electrode 338 and a second link contact hole 353 exposing the other end of the data link line 307.

Figure 9F:
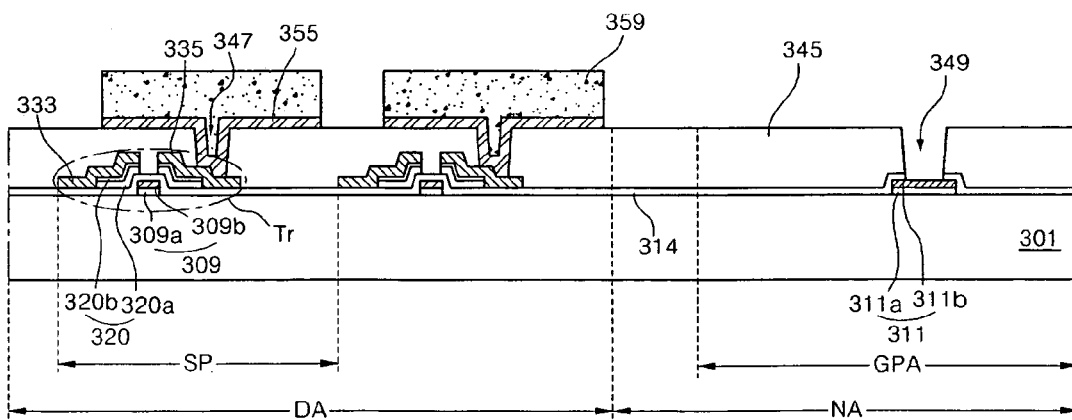
Figure 10F:
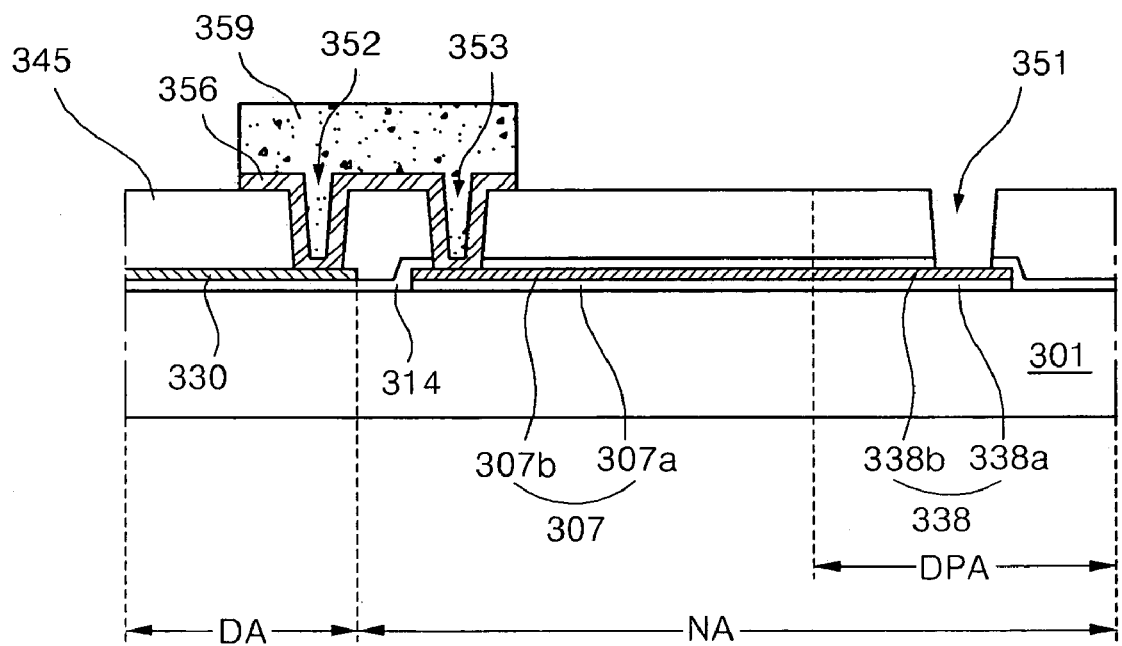

As illustrated in FIGS. 9F and 10F, a fourth conductive material is deposited on the passivation layer 345, and a photoresist is deposited on the fourth conductive material. The fourth conductive material may include a material used for the second electrode (390 of FIG. 7), such as aluminum (Al) and aluminum alloy (AlNd) having a low work function. Exposing and developing processes for the photoresist are conducted to form a photoresist pattern 359. Then, the fourth conductive material layer is patterned with the photoresist pattern 359 to form a connection electrode 355 contacting the drain electrode 335 through the drain contact hole 347, and a link pattern 356 contacting the data line 330 and the data link line 307 through the first and second link contact holes 352 and 353, respectively. The photoresist pattern 359 still remains on the connection electrode 355 and the link pattern 356.

Figure 9G:
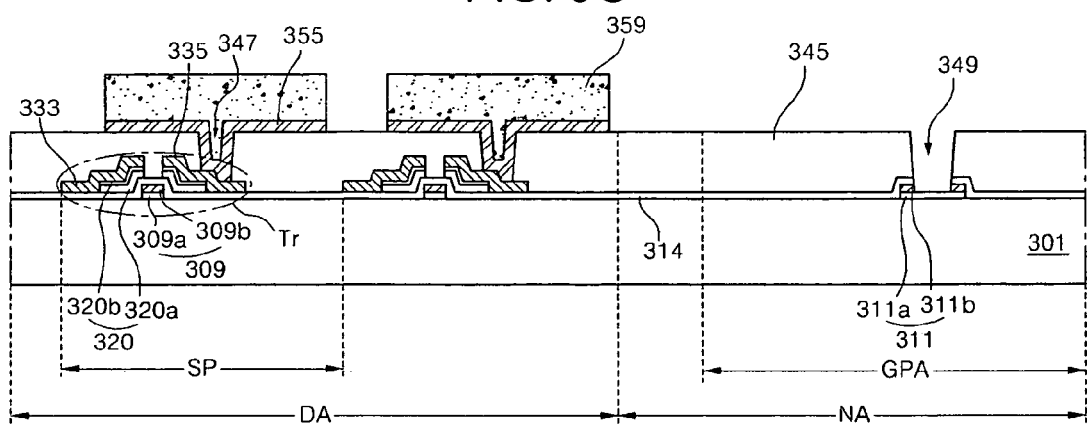
Figure 10G:
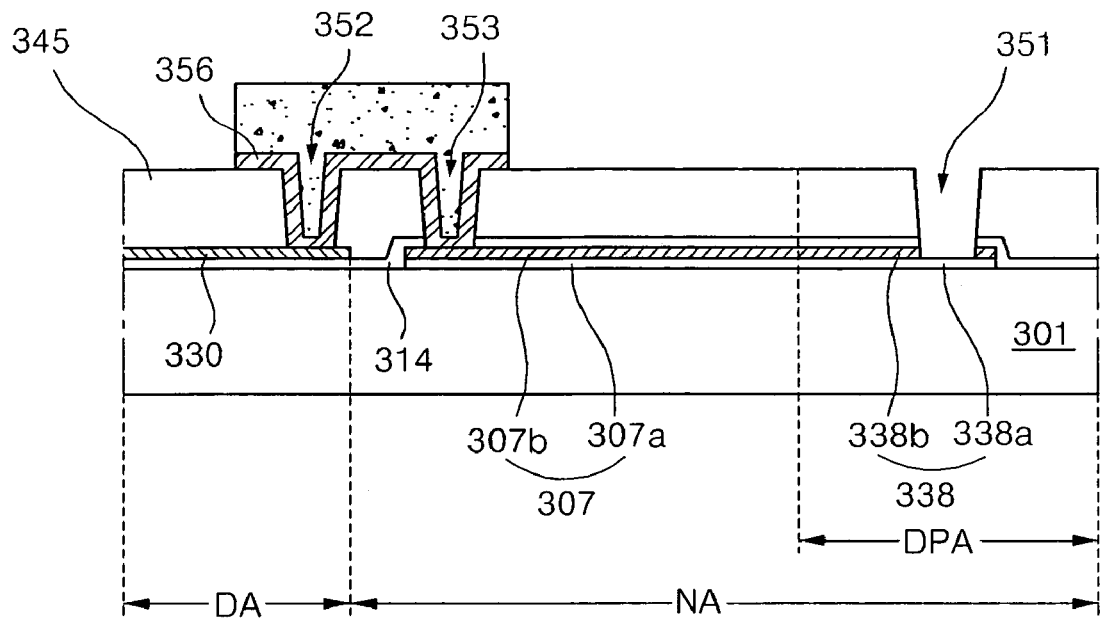

As illustrated in FIGS. 9G and 10G, with the photoresist pattern 359 remaining on the connection electrode 355 and the link pattern 356, a dry etching or wet etching is conducted. By the etching process, the second layers (the upper layers) 311b and 338b of the gate and data pad electrodes 311 and 338 exposed through the gate and data pad contact holes 349 and 351 are removed, and thus the first layers (the lower layers) 311a and 338a of the gate and data pad electrodes 311 and 338 are exposed. In other words, the second layers 311b and 338b that have a low resistivity and are susceptible to corrosion are removed by the etching process, and the first layers 311a and 338b having a tolerance to corrosion are exposed.

Figure 9H:
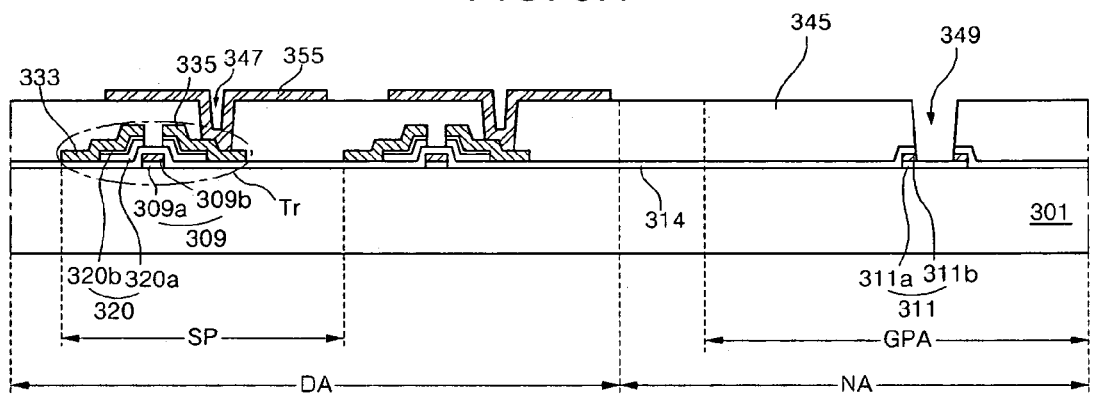
Figure 10H:
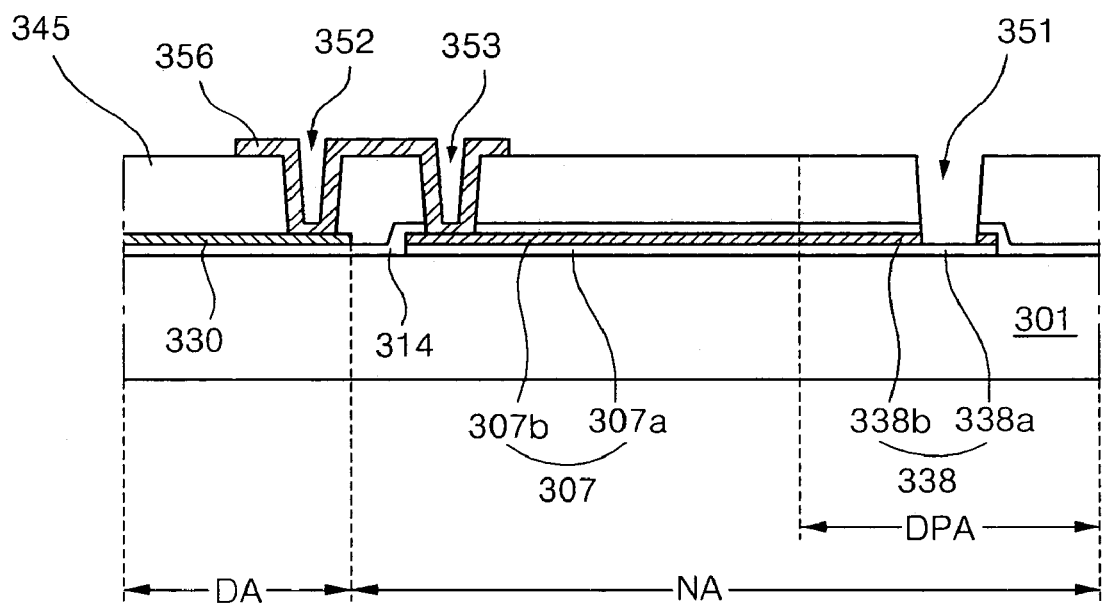

As illustrated in FIGS. 9H and 10H, the photoresist pattern (359 of FIGS. 9G and 10G) is removed by a stripping or ashing process.

Through the above-described processes, the first substrate for the dual-panel type OELD device according to the third embodiment is fabricated.

A fabrication method of the second substrate for the dual-panel type OELD device is described with reference to FIGS. 7 and 8.

As illustrated in FIGS. 7 and 8, the first electrode 375 is formed on the entire second substrate 371. The first electrode 375 may be made of a transparent conductive material such as indium-tin-oxide (ITO) and indium-zinc-oxide (IZO) having a high work function. When the first electrode 375 has a work function higher than the second electrode 390, the first and second electrodes 375 and 390 act as an anode and a cathode, respectively.

An inorganic insulating material is deposited on the first electrode 375 and patterned to form first and second insulating patterns 377 and 378. The first insulating pattern 377 is formed between adjacent sub-pixel regions "SP", and the second insulating pattern 378 is formed in the sub-pixel region "SP".

An organic insulating material is deposited on the substrate 371 having the insulating patterns 377 and 378 and patterned to form a separator 381 and a spacer 384. The separator 381 is formed on the first insulating pattern 377, and the spacer 384 is formed on the second insulating pattern 378. The spacer 384 has a height higher than the separator 381 such that the second electrode 390 contacts the connection electrode 355.

To form the separator 381 and the spacer 384 having different heights, a diffraction exposure method or a halftone exposure method may be used. For example, a photoresist is deposited on the organic insulating material used for the separator 381 and the spacer 384. Then, a diffraction exposure or a halftone exposure to the photoresist is conducted to form first and second photoresist patterns corresponding to the first and second insulating patterns 377 and 378, respectively, and portions of the photoresist except for the first and second photoresist patterns are removed. The second photoresist pattern has a height higher than the first photoresist pattern. Then, the organic insulating material exposed through the first and second photoresist patterns is removed to form first and second organic insulating patterns below the first and second photoresist patterns, respectively. Then, the first photoresist pattern is removed by a stripping or ashing process. Although the first photoresist pattern is removed, the second photoresist pattern is partially removed and remains on the second organic insulating pattern. Then, the first organic insulating pattern is partially removed by a predetermined thickness. However, the second organic insulating pattern is not removed due to the second photoresist pattern. Accordingly, the second organic insulating pattern has a height higher than the first insulating pattern. Then, the second photoresist pattern is removed. Through the above-described processes, the separator 381 and the spacer 384 corresponding to the first and second organic insulating patterns, respectively, are formed.

After forming the separator 381 and the spacer 384, red (R), green (G) and blue (B) organic emitting materials are sequentially coated to form red (R), green (G) and blue (B) organic emitting layers 387a, 387b and 387c in respective sub-pixel regions "SP". If the organic emitting layer 387 is formed by an evaporation method using a shadow mask, not by a coating method, the separator 381 and the first insulating pattern 377 may not be formed.

Then, the second electrode 390 is formed on the organic emitting layer 387 in each sub-pixel region "SP". The second electrode 390 is separated by the separator 371. The second electrode 390 is continuous in the sub-pixel region "SP" and includes a first portion on the organic emitting layer 387 and a second portion covering the spacer 384. The second portion protruded by the spacer 384 contacts the connection electrode 355. When the second electrode 390 functions as a cathode, it may be made of aluminum (Al) and aluminum alloy (AlNd) having a lower work function than the first electrode 375.

Although not shown in the drawings, when the first and second electrodes 375 and 390 act as an anode and a cathode, respectively, a hole injection layer and a hole transmitting layer are sequentially formed between the first electrode 375 and the organic emitting layer 387, and an electron injection layer and an electron transmitting layer may be formed between the second electrode 390 and the organic emitting layer 387.

A seal pattern 393 is formed along a peripheral portion of one of the first and second substrates 301 and 371. Under a vacuum condition or an inert gas condition, the first and second substrates 301 and 371 are attached with the seal pattern 393 such that the protruded portion of the second electrode 390 on the spacer 384 contacts the connection pattern 355. Therefore, the dual-panel type OELD device is fabricated.

In the above-described OELD devices, a conductive material having a tolerance to corrosion is used for the layers of the gate and data pads exposed to an air condition. Accordingly, a corrosion of the gate and data pads can be minimized or prevented.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An electroluminescent display device, comprising:
    first and second substrates facing each other and having a plurality of sub-pixel regions;
    a gate line on the first substrate;
    a data line crossing the gate line to define the sub-pixel region on the first substrate;
    an array element connected to the gate and data lines;
    a data link line spaced apart from the data line;
    a link pattern electrically connected to the data line and the data link line;
    a connection electrode connected to the array element and disposed in the sub-pixel region;
    a gate pad electrode electrically connected to the gate line and having lower and upper layers;
    a data pad electrode extended from the data link line and having lower and upper layers, the data pad electrode disposed at the same layer as the gate pad electrode; and
    an electroluminescent diode on the second substrate,
    wherein the upper layers of the gate and data pad electrodes have gate and data pad contact holes exposing the lower layers of the gate and data pad electrodes, respectively.

2. The device according to claim 1, wherein the lower layer is made of a conductive material having a tolerance to corrosion.

3. The device according to claim 2, wherein the lower layer includes a transparent conductive material.

4. The device according to claim 1, wherein the upper layer includes one of aluminum (Al), aluminum alloy (AlNd), copper (Cu), molybdenum (Mo) and titanium (Ti).

5. The device according to claim 1, wherein the upper layer has a multi-layered structure.

6. The device according to claim 1, wherein the link pattern electrically connecting the data line and the data link line through a first link contact hole and a second link contact hole respectively.

7. The device according to claim 6, wherein the link pattern is disposed at the same layer as the connection electrode.

8. The device according to claim 7, further comprising a seal pattern for attaching the first and second substrates, wherein the link pattern is surrounded by an outline of the seal pattern.

9. The device according to claim 8, wherein a portion of the link pattern underlies the seal pattern.

10. The device according to claim 8, wherein a space between the first and second substrates surrounded by the seal pattern is under a vacuum condition or inert gas condition.

11. The device according to claim 7, further comprising a gate insulator on the gate line, and a passivation layer on the data line.

12. The device according to claim 11, wherein the gate insulator and the passivation layer have the gate and data pad contact holes along with the upper layers of the gate and data pad electrodes.

13. The device according to claim 11, wherein the passivation layer has a first link contact hole exposing the data line, and the gate insulator and the passivation layer have a second link contact hole exposing the data link line, the link pattern contacting the data line and the data link line through the first and second link contact holes, respectively.

14. The device according to claim 11, wherein the passivation layer has a drain contact hole exposing the array element, the connection electrode contacting the array element through the drain contact hole.

15. The device according to claim 1, wherein the array element includes a driving thin film transistor connected to the connection electrode and a switching thin film transistor.

16. The device according to claim 1, wherein the electroluminescent diode includes a first electrode, an emitting layer and a second electrode sequentially disposed on the second substrate.

17. The device according to claim 16, further comprising a spacer on the first electrode in the sub-pixel region, the spacer having a first height to contact a portion of the second electrode covering the spacer and the connection electrode.

18. The device according to claim 17, further comprising a separator on the first electrode between the adjacent sub-pixel regions, the separator having a second height less than the first height.

19. The device according to claim 16, wherein the second electrode includes one of alkaline metal and alkaline-earth metal.

20. The device according to claim 16, wherein the second electrode and the connection electrode are made of a conductive material having a work function lower than the first electrode.

21. The device according to claim 20, wherein the connection electrode includes one of aluminum (Al), aluminum alloy (AlNd), copper (Cu), molybdenum (Mo) and titanium (Ti).

22. The device according to claim 20, wherein the first electrode is made of a transparent conductive material including indium-tin-oxide (ITO) or indium-zinc-oxide (IZO).

23. A method of fabricating an electroluminescent display device, comprising:
  forming a gate line, a gate pad electrode at one end of the gate line and a data pad electrode on a first substrate, the gate line and the gate and data pad electrodes each having lower and upper layers;
  forming a gate insulator covering the gate line and the gate and data pad electrodes;
  forming a data line on the gate insulator crossing the gate line to define a sub-pixel region;
  forming a data link line connected to the data line in the same process of forming the gate line;
  forming an array element connected to the gate and data lines;
  forming a passivation layer on the array element;
  forming a connection electrode on the passivation layer in the sub-pixel region;
  exposing the lower layers of the gate and data pad electrodes;
  forming a link pattern connecting the data line and the data link line in the same process of forming the connection electrode;
  forming an electroluminescent diode on a second substrate; and attaching the first and second substrates.

24. The method according to claim 23, wherein the forming the connection electrode includes: depositing a conductive material and a photoresist on the conductive material; patterning the photoresist to form a photoresist pattern; and patterning the conductive material with the photoresist pattern.

25. The method according to claim 24, wherein the exposing the lower layers of the gate and data pad electrodes includes: patterning the passivation layer and the gate insulator to form gate and data pad contact holes exposing the upper layers of the gate and data pad electrodes before forming the connection electrode, respectively; and etching the upper layers of the gate and data pad electrodes with the photoresist pattern after forming the connection electrode.

26. The method according to claim 25, further comprising removing the photoresist pattern after exposing the lower layers of the gate and data pad electrodes.

27. The method according to claim 23, wherein the lower layer is made of a conductive material having a tolerance to corrosion.

28. The method according to claim 27, wherein the lower layer includes a transparent conductive material.

29. The method according to claim 23, wherein the upper layer includes one of aluminum (Al), aluminum alloy (AlNd), copper (Cu), molybdenum (Mo) and titanium (Ti).

30. The method according to claim 23, wherein the upper layer has a multi-layered structure.

31. The method according to claim 23, wherein the first and second substrates are attached with a seal pattern, and the link pattern is surrounded by an outline of the seal pattern.

32. The method according to claim 31, wherein a portion of the link pattern underlies the seal pattern.

33. The method according to claim 23, wherein the first and second substrates are attached under a vacuum condition or inert gas condition.

34. The method according to claim 23, further comprising patterning the passivation layer to form a first link contact hole exposing the data line, and patterning the passivation layer and the gate insulator to form a second link contact hole exposing the data link line, the link pattern contacting the data line and the data link line through the first and second link contact holes, respectively.

35. The method according to claim 23, further comprising patterning the passivation layer to form a drain contact hole exposing the array element, the connection electrode contacting the array element through the drain contact hole.

36. The method according to claim 23, wherein forming the array element includes forming a driving thin film transistor connected to the connection electrode and a switching thin film transistor.

37. The method according to claim 23, wherein forming the electroluminescent diode includes forming a first electrode, an emitting layer and a second electrode sequentially on the second substrate.

38. The method according to claim 37, further comprising forming a spacer in the sub-pixel region on the first electrode, the spacer having a first height to contact a portion of the second electrode covering the spacer and the connection electrode.

39. The method according to claim 38, further comprising forming a separator on the first electrode between the adjacent sub-pixel regions in the same process of forming the spacer, the separator having a second height less than the first height.

40. The method according to claim 39, wherein forming the spacer and the separator includes:

depositing an organic insulating material and a photoresist on the organic insulating material;

forming first and second photoresist patterns, the second photoresist pattern higher than the first photoresist pattern;

etching the organic insulating material with the first and second photoresist patterns to form a first organic insulating pattern below the first photoresist pattern and the spacer below the second photoresist pattern;

completely removing the first photoresist pattern and partially removing the second photoresist pattern; and partially removing the first organic insulating pattern to form the separator.

41. The method according to claim 37, wherein the second electrode includes one of alkaline metal and alkaline-earth metal.

42. The method according to claim 37, wherein the second electrode and the connection electrode are made of a conductive material having a work function lower than the first electrode.

43. The method according to claim 42, wherein the connection electrode includes one of aluminum (Al), aluminum alloy (AlNd), copper (Cu), molybdenum (Mo) and titanium (Ti).

44. The method according to claim 42, wherein the first electrode is made of a transparent conductive material including indium-tin-oxide (ITO) and indium-zinc-oxide (IZO).

* * * * *